United States Patent
Cheng et al.

(10) Patent No.: US 11,537,016 B2
(45) Date of Patent: Dec. 27, 2022

(54) METHOD OF MANUFACTURING ARRAY SUBSTRATE, AND ARRAY SUBSTRATE

(71) Applicants: HEFEI XINSHENG OPTOELECTRONICS TECHNOLOGY CO., LTD., Anhui (CN); BOE Technology Group Co., Ltd., Beijing (CN)

(72) Inventors: Leilei Cheng, Beijing (CN); Jingang Fang, Beijing (CN); Luke Ding, Beijing (CN); Jun Liu, Beijing (CN); Wei Li, Beijing (CN); Bin Zhou, Beijing (CN)

(73) Assignees: HEFEI XINSHENG OPTOFTFCTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 123 days.

(21) Appl. No.: 16/964,278

(22) PCT Filed: Dec. 13, 2019

(86) PCT No.: PCT/CN2019/125208
§ 371 (c)(1),
(2) Date: Jul. 23, 2020

(87) PCT Pub. No.: WO2020/155887
PCT Pub. Date: Aug. 6, 2020

(65) Prior Publication Data
US 2021/0124226 A1   Apr. 29, 2021

(30) Foreign Application Priority Data
Feb. 2, 2019 (CN) .......................... 201910108116.X

(51) Int. Cl.
*G02F 1/1333* (2006.01)
*G02F 1/1362* (2006.01)
(Continued)

(52) U.S. Cl.
CPC .. *G02F 1/136227* (2013.01); *H01L 21/76804* (2013.01); *H01L 23/5329* (2013.01);
(Continued)

(58) Field of Classification Search
CPC ............ G02F 1/1333; G02F 1/133345; G02F 1/136227; H01L 21/76804; H01L 21/48;
(Continued)

(56) References Cited

U.S. PATENT DOCUMENTS

| | | | |
|---|---|---|---|
| 5,841,196 A | 11/1998 | Gupta et al. | |
| 6,172,721 B1 * | 1/2001 | Murade | G02F 1/1368 438/670 |

(Continued)

FOREIGN PATENT DOCUMENTS

| | | |
|---|---|---|
| CN | 102110642 A | 6/2011 |
| CN | 102354684 A | 2/2012 |

(Continued)

OTHER PUBLICATIONS

First Office Action, including Search Report, for Chinese Patent Application No. 201910108116.X, dated Mar. 30, 2020, 23 pages.

*Primary Examiner* — Thoi V Duong
(74) *Attorney, Agent, or Firm* — Westman, Champlin & Koehler, P.A.

(57) ABSTRACT

A method of manufacturing an array substrate is provided, which comprises: forming a first metal layer and an insulating layer in sequence on a base substrate, the insulating layer covering the first metal layer; forming an etch barrier layer on the insulating layer; etching the etching barrier layer and the insulating layer multiple times, wherein an (Continued)

effective blocking area of the etching barrier layer decreases successively in each etching to form a connection hole penetrating the insulating layer, the connection hole includes a plurality of via holes connected in sequence, and a slope angle of a hole wall of each via hole is smaller than a preset slope angle; and forming a second metal layer, the second metal layer being connected to the first metal layer through the connection hole.

13 Claims, 7 Drawing Sheets

(51) Int. Cl.
H01L 21/768 (2006.01)
H01L 23/532 (2006.01)
H01L 27/12 (2006.01)

(52) U.S. Cl.
CPC ........ *H01L 27/124* (2013.01); *H01L 27/1248* (2013.01); *G02F 1/133345* (2013.01)

(58) Field of Classification Search
CPC . H01L 23/5329; H01L 23/498; H01L 27/124; H01L 27/1248
See application file for complete search history.

(56) References Cited

U.S. PATENT DOCUMENTS

| 9,111,809 B2* | 8/2015 | Takeuchi | H01L 27/14603 |
| 10,374,062 B2 | 8/2019 | Sun | |
| 2018/0097087 A1 | 4/2018 | Sun | |

FOREIGN PATENT DOCUMENTS

| CN | 102543836 A | 7/2012 |
| CN | 104377180 A | 2/2015 |
| CN | 105552091 A | 5/2016 |
| CN | 106449397 A | 2/2017 |
| CN | 106783727 A | 5/2017 |
| CN | 106783894 A | 5/2017 |
| CN | 108735895 A | 11/2018 |
| CN | 108878352 A | 11/2018 |
| CN | 109817531 A | 5/2019 |
| JP | H06333882 A | 12/1994 |

\* cited by examiner

METHOD OF MANUFACTURING ARRAY SUBSTRATE, AND ARRAY SUBSTRATE

CROSS-REFERENCE TO RELATED APPLICATION

This application is a Section 371 National Stage Application of International Application No. PCT/N2019/125208 filed on Dec. 13, 2019, entitled "METHOD OF MANUFACTURING ARRAY SUBSTRATE, AND ARRAY SUBSTRATE", which claims priority to Chinese Patent Application No. 201910108116.X filed on Feb. 2, 2019 with the China National Intellectual Property Administration, the disclosure of which are incorporated herein by reference in their entirties.

TECHNICAL FIELD

The present disclosure relates to the field of display technology, and in particular, to a method of manufacturing an array substrate, and an array substrate.

BACKGROUND

With the continuous development of display technology, high-precision display technology (such as 8K display technology) has become an important research and development direction. In high-precision display technology, the wiring manner of the array substrate is denser, and the dense wiring manner requires the insulating layer between the metal wires to have a good connection hole for connection. The hole wall of the connection hole produced by the related art process usually has a large slope angle.

SUMMARY

According to an aspect of the present disclosure, there is provided a method of manufacturing an array substrate, comprising:

forming a first metal layer and an insulating layer in sequence on a base substrate, the insulating layer covering the first metal layer;

forming an etch barrier layer on the insulating layer;

etching the etching barrier layer and the insulating layer multiple times, wherein an effective blocking area of the etching barrier layer decreases successively in each etching to form a connection hole penetrating the insulating layer, the connection hole includes a plurality of via holes connected in sequence, and a slope angle of a hole wall of each via hole is smaller than a preset slope angle; and forming a second metal layer, the second metal layer being connected to the first metal layer through the connection hole.

In some embodiments, the preset slope angle is greater than 70°, and the slope angle of the hole wall of the via holes is from 50° to 70°.

In some embodiments, the step of etching the etching barrier layer and the insulating layer multiple times, to form a connection hole penetrating the insulating layer, comprises:

coating a photoresist on the etching barrier layer;

forming a photoresist hole by a patterning process;

etching, by using a first etching process, the etching barrier layer in the photoresist hole to form a first etched hole;

etching, by using a second etching process, the insulating layer in the first etching hole to form a first transition hole not penetrating the insulating layer;

etching, by using a third etching process, the etching barrier layer to form a second etched hole;

etching, by using a fourth etching process, the second etched hole and the insulating layer in the first transition hole to form the connection hole penetrating the insulating layer;

wherein, the connection hole comprises a first via hole opening to the etching barrier layer and a second via hole communicated with the first via hole and opening to the first metal layer, the slope angle of the hole wall of the second via hole is greater than the slope angle of the hole wall of the first via hole.

In some embodiments, the step of forming a second metal layer, comprises:

removing the photoresist remained on the etching barrier layer;

removing the etching barrier layer remained on the insulating layer;

forming the second metal layer on the insulating layer from which the etching barrier layer is removed.

In some embodiments, material of the etching barrier layer is chromium; the first etching process is a dry etching process or a wet etching process, and the third etching process is a dry etching process or a wet etching process; wherein, an etching gas used in the dry etching process is $O_2$, and an etching solution used in the wet etching process includes ammonium cerium nitrate, glacial acetic acid and water.

In some embodiments, the second etching process and the fourth etching process are both dry etching processes, and an etching gas used is a mixed gas of $SF_6$ and $O_2$, or a mixed gas of $CF_4$ and $O_2$.

In some embodiments, the step of etching the etching barrier layer and the insulating layer multiple times, to form a connection hole penetrating the insulating layer, comprises:

oxidizing, by using a first mask, the etching barrier layer to obtain a first oxide layer;

etching, by using a fifth etching process, the first oxide layer to form a second transition hole;

oxidizing, by using a second mask, the etching barrier layer to obtain a second oxide layer, an aperture of an opening of the second mask being larger than an aperture of an opening of the first mask;

etching, by using a sixth etching process, the second oxide layer and the insulating layer, to form the connection hole penetrating the insulating layer;

wherein, the connection hole comprises a first via hole opening to the etching barrier layer and a second via hole communicated with the first via hole and opening to the first metal layer, the slope angle of the hole wall of the second via hole is greater than the slope angle of the hole wall of the first via hole.

In some embodiments, the step of forming a second metal layer, comprises:

oxidizing the remained etching barrier layer to obtain a third oxide layer; and forming the second metal layer on the third oxide layer.

In some embodiments, material of the etching barrier layer is organosiloxane; the etching barrier layer is oxidized by ultraviolet ray or ozone; the fifth etching process and the sixth etching process are both dry etching processes, and an etching gas used is $CF_4$.

According to another aspect of the present disclosure, there is provided an array substrate, comprising:

a base substrate;

a first metal layer on the base substrate;

an insulating layer covering the first metal layer, wherein the insulating layer is provided with a connection hole penetrating the insulating layer;

a second metal layer connected to the first metal layer through the connection hole, wherein the connection hole includes a plurality of via holes connected in sequence, and a slope angle of a hole wall of each via hole is less than a preset slope angle and gradually decrease in a direction away from the base substrate.

In some embodiments, the preset slope angle is greater than 70°, and the slope angle of the hole wall of the via holes is from 50° to 70°.

In some embodiments, the connection hole comprises a first via hole opening to the second metal layer and a second via hole communicated with the first via hole and opening to the first metal layer, the slope angle of the hole wall of the second via hole is greater than the slope angle of the hole wall of the first via hole.

In some embodiments, the insulating layer is a multilayer structure, and layers in the multilayer structure that are respectively in contact with the first metal layer and the second metal layer are made of an insulating material.

DETAILED DESCRIPTION OF EMBODIMENTS

In order to make the above-mentioned objects, features and advantages of the present disclosure more obvious and understandable, the present disclosure will be further described in detail in conjunction with the accompanying drawings and specific embodiments.

Figure 1:
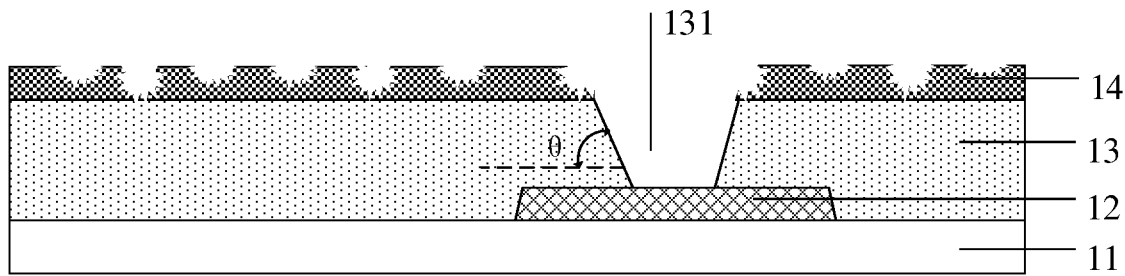
FIG. 1 shows a schematic structural diagram of an array substrate in related art.

As shown in FIG. 1, when manufacturing an array substrate, first a first metal layer 12 and an insulating layer 13 are formed on a base substrate 11 in sequence, a photoresist 14 is coated on the insulating layer 13, and then the photoresist 14 is exposed and developed to form a photoresist hole, a dry etching is performed on the insulating layer 13 based on the photoresist hole to form a connection hole 131 penetrating the insulating layer.

Figure 2:
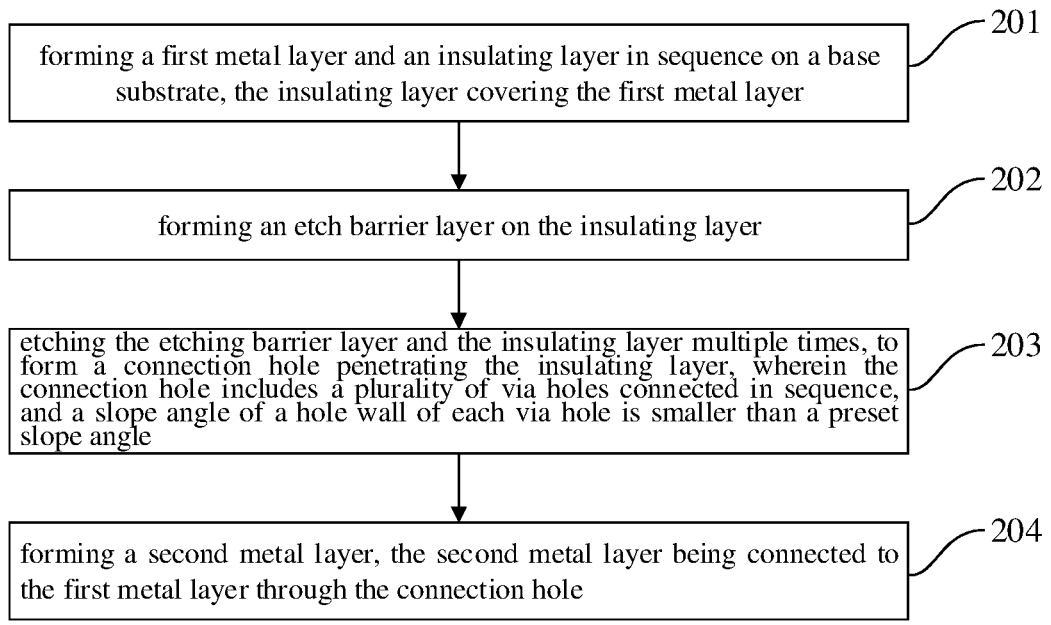
FIG. 2 shows a flowchart of a method of manufacturing an array substrate according to an embodiment of the present disclosure.

However, in the actual manufacturing process, due to the relatively thick thickness of the insulating layer 13, the slope angle θ of the connection hole 131 formed by dry etching is relatively large. Generally, the slope angle θ will be greater than 70° or even reach about 80°. Slope angle θ is more likely to produce a larger film layer difference, so that when a second metal layer connected to the first metal layer 12 through the connection hole 131 is produced later, it is easy to produce poor coverage or disconnection, resulting in poor connection between the first metal layer 12 and the second metal layer. Referring to FIG. 2, a flowchart of a method of manufacturing an array substrate according to an embodiment of the present disclosure is shown, the method may specifically include the following steps.

Step 201 is of forming a first metal layer and an insulating layer in sequence on a base substrate, the insulating layer covering the first metal layer.

Figure 3:
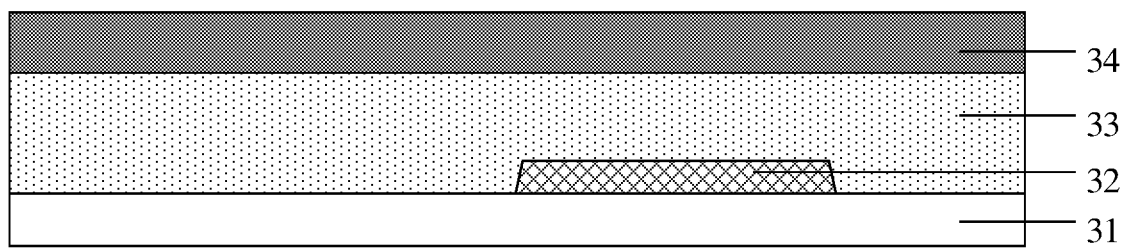
FIG. 3 shows a schematic structural view obtained after forming an etching barrier layer on an insulating layer according to an embodiment of the present disclosure.

As shown in FIG. 3, firstly, the base substrate 31 is provided. The base substrate 31 may be a PI (Polyimide) substrate or a glass substrate. The first metal layer 32 is formed on the base substrate 31 through a patterning process. The patterning process includes metal film deposition, photoresist coating, mask exposure, development, etching, photoresist stripping and other processes, the material of the first metal layer 32 can be a single metal material, such as Al, Cu, Mo, etc., the material of the first metal layer 32 can also be a laminated material consisted of a variety of metals. For example, the first metal layer 32 includes two layers of metal materials. The two layers of metal materials are respectively Al and Cu. The material of the first metal layer 32 may also be a metal alloy material, such as MoNb.

Then, PECVD (Plasma Enhanced Chemical Vapor Deposition) or other deposition methods are used to deposit the insulating layer 33 so that the insulating layer 33 covers the first metal layer 32, and the material of the insulating layer 33 is silicon oxide or silicon nitride or silicon oxynitride.

Step 202 is of forming an etch barrier layer on the insulating layer.

As shown in FIG. 3, the etching barrier layer 34 is formed on the insulating layer 33, and the material of the etching barrier layer 34 is chromium or organosiloxane. When the material of the etching barrier layer 34 is chromium, a sputtering process may be used to form the etching barrier layer 34 on the insulating layer 33; when the material of the etching barrier layer 34 is organosiloxane, a coating process or a spin coating process may be used to form the etching barrier layer 34 on the insulating layer 33. In order to increase the adhesion of the insulating layer 33 to the etching barrier layer 34, the insulating layer 33 may be subjected to $O_2$ plasma treatment or surface hydroxylation treatment, and then the etching barrier layer 34 is formed on the insulating layer 33, wherein the organosiloxane can be polydimethylsiloxane, or a modified polymer of polymethylsiloxane.

Step 203 is of etching the etching barrier layer and the insulating layer multiple times, wherein an effective blocking area of the etching barrier layer decreases successively in each etching to form a connection hole penetrating the insulating layer, the connection hole includes a plurality of via holes connected in sequence, and a slope angle of a hole wall of each via hole is smaller than a preset slope angle.

In the embodiments of the present disclosure, according to the size requirements of the connection hole, the etching barrier layer 34 and the insulating layer 33 are etched multiple times, and the effective blocking area of the etching barrier layer for the etching is reduced successively for each etching, so that the connection hole formed through the insulating layer 33 includes a plurality of via holes connected in sequence, and since only a portion of the insulating layer 33 needs to be etched each time, the thickness of the insulating layer etched each time is small, so it can be guaranteed that the hole wall of each via hole in the formed connection hole has a slope angle smaller than the preset slope angle, thereby reducing the slope angle of the hole wall of the connection hole.

In cases, the preset slope angle is greater than 70°, and the slope angle of the via wall of the hole wall is from 50° to 70°, and the preset slope angle refers to a slope angle of the connection hole 131 formed in the related art.

Figure 4:
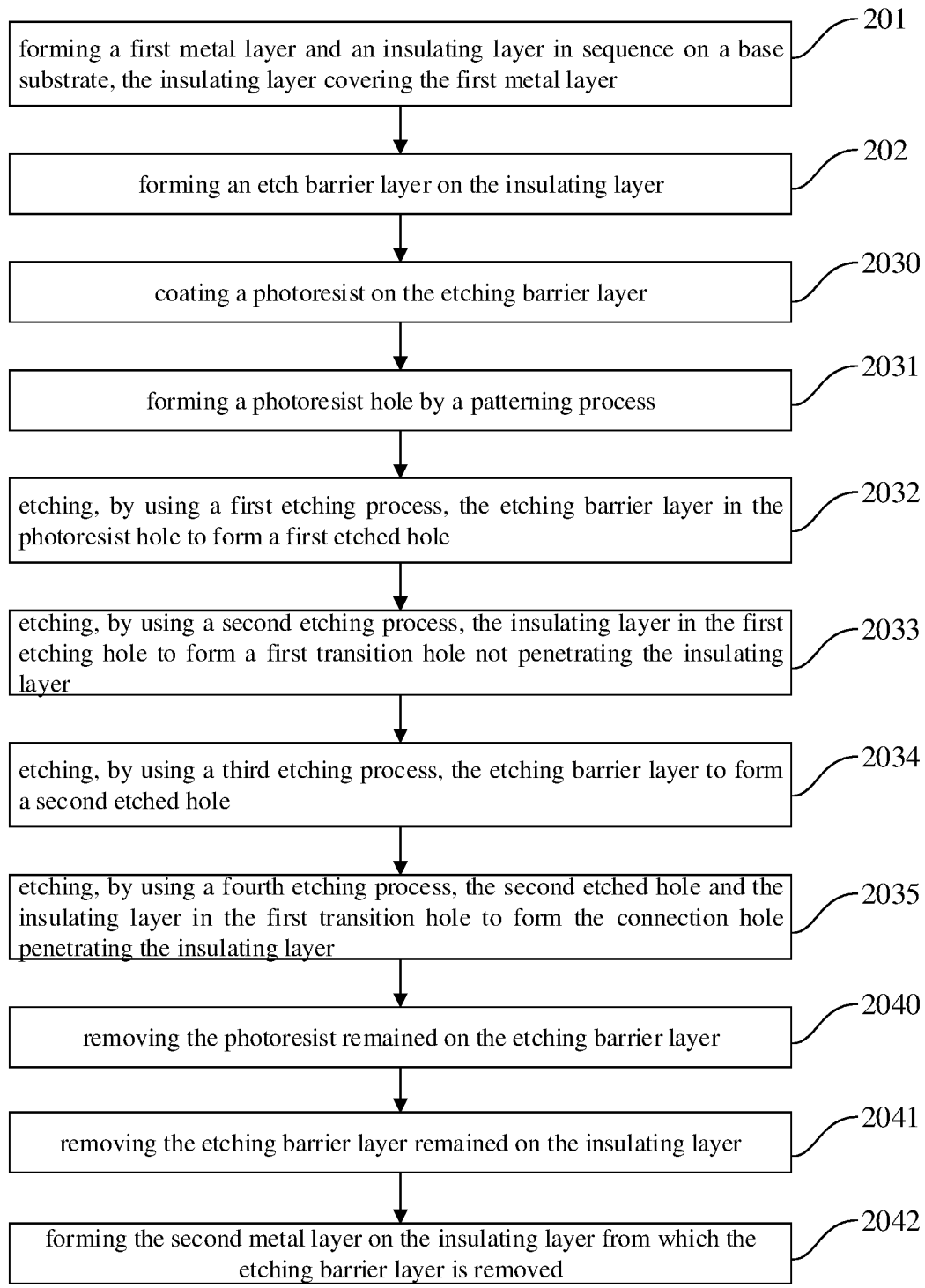
FIG. 4 shows a specific flowchart of a method for manufacturing an array substrate according to a first embodiment of the present disclosure.

Referring to FIG. 4, a specific flowchart of the method of manufacturing an array substrate according to the first embodiment of the present disclosure is shown.

In the first embodiment of the present disclosure, the material of the etching barrier layer 34 is chromium, and step 203 may specifically include:

a sub-step 2030 of coating a photoresist on the etching barrier layer;

a sub-step 2031 of forming a photoresist hole by a patterning process;

a sub-step 2032 of etching, by using a first etching process, the etching barrier layer in the photoresist hole to form a first etched hole;

a sub-step 2033 of etching, by using a second etching process, the insulating layer in the first etching hole to form a first transition hole not penetrating the insulating layer;

a sub-step 2034 of etching, by using a third etching process, the etching barrier layer to form a second etched hole;

a sub-step 2035 of etching, by using a fourth etching process, the second etched hole and the insulating layer in the first transition hole to form the connection hole penetrating the insulating layer;

wherein, the connection hole comprises a first via hole opening to the etching barrier layer and a second via hole communicated with the first via hole and opening to the first metal layer, the slope angle of the hole wall of the second via hole is greater than the slope angle of the hole wall of the first via hole.

FIGS. 5-11 are schematic diagrams of manufacturing an array substrate according to the first embodiment of the present disclosure.

Figure 5:
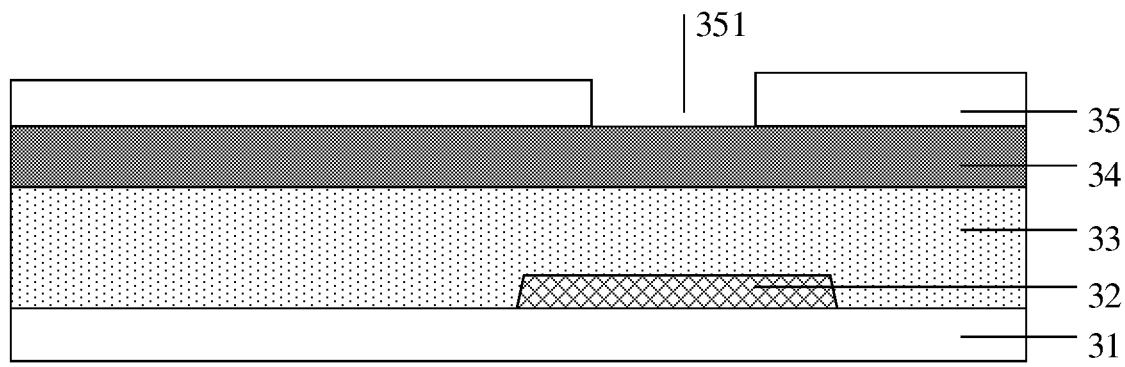
FIG. 5 shows a schematic structural diagram obtained after forming a photoresist hole on an etching barrier layer according to the first embodiment of the present disclosure.

As shown in FIG. 5, a photoresist 35 is coated on the etching barrier layer 24, and a photoresist hole 351 is formed through a patterning process. The patterning process may include exposure and development. Among them, the photoresist 35 may be a positive photoresist or a negative photoresist. When the photoresist 35 is a positive photoresist, the area corresponding to photoresist hole 351 is the exposed area. The photoresist 35 of the exposed area is removed after development, and the photoresist 35 of the unexposed area is retained after development. When photoresist 35 is a negative photoresist, the area corresponding to the photoresist hole 351 is the unexposed area, the photoresist 35 of the exposed area is retained after development, and the photoresist 35 of the unexposed area is removed after development.

Figure 6:
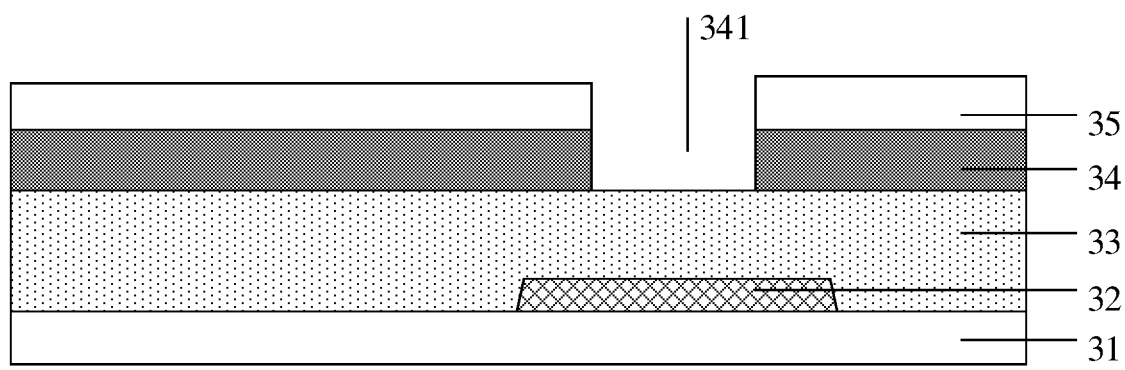
FIG. 6 shows a schematic structural diagram of etching the etching barrier layer in the photoresist hole to form a first etched hole according to the first embodiment of the present disclosure.

As shown in FIG. 6, the etching barrier layer 34 in the photoresist hole 351 is etched using a first etching process to form the first etched hole 341. The first etching process is a dry etching process or a wet etching process, in which the etching gas used in the dry etching process is $O_2$, and the etching solution used in the wet etching process includes ammonium cerium nitrate, glacial acetic acid and water.

When the etching barrier layer 34 in the photoresist hole 351 is etched by a wet etching process, the corresponding etching temperature is 40° C. The main principle of the wet etching process is: $Ce(IV)+Cr \rightarrow Ce(III)+Cr(III)$, where Ce(IV) has strong oxidizability under acidic conditions, and can oxidize chromium to an ionic state, so that the etching barrier layer 34 is etched away. In the first embodiment of the present disclosure, the thickness of the etching barrier layer 34 is 10-50 nm, and the length of time that the etching barrier layer 34 is completely etched by the wet etching process is 60 s-300 s.

When the etching barrier layer 34 in the photoresist hole 351 is etched using a dry etching process, the etching gas used in the dry etching process is $O_2$. In addition, in order to allow the vacuum pressure in the dry etching equipment to perform etching can reach 2-3 Pa, the etching gas used in the dry etching process can also be a mixed gas of Ar and $O_2$. $O_2$ is used as the etching gas. Ar is used to adjust the vacuum pressure required for etching. In the first embodiment, the thickness of the etching barrier layer 34 is 10-50 nm, and the length of time that the etching barrier layer 34 is completely etched by the dry etching process is 60 s-300 s.

Figure 7:
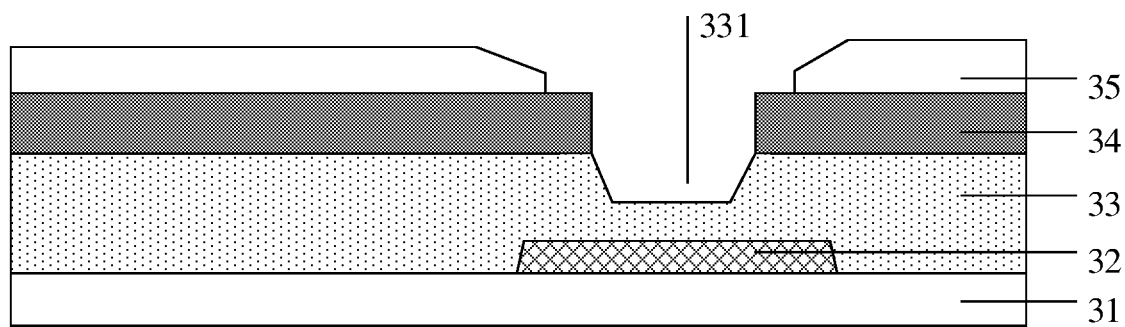
FIG. 7 shows a schematic structural diagram of forming a first transition hole after etching the insulating layer in the first etched hole according to the first embodiment of the present disclosure.

As shown in FIG. 7, the second etching process is used to etch the insulating layer 33 in the first etched hole 341 to form the first transition hole 331 that does not penetrate the insulating layer 33. The second etching process is a dry etching process, and the etching gas used is a mixed gas of $SF_6$ and $O_2$, or a mixed gas of $CF_4$ and $O_2$.

The etching selection ratio of the etching gas used for the second etching process to the insulating layer 33 and the etching barrier layer 34 is greater than 10:1, so that when the second etching process is used to etch the insulating layer 33, the etching amount to the etching barrier layer 34 is very small, thereby reducing the impact on the etching barrier layer 34. The etching selection ratio refers to the ratio of the etching gas to the etching rate of the insulating layer 33 and the etching barrier layer 34. In addition, due to the etching gas $O_2$ used in the second etching process will have a certain ashing effect on the photoresist 35, the photoresist 35 near the first transition hole 331 is etched, and then the photoresist 35 on the etching barrier layer 34 near the first transition hole 331 is removed.

Figure 8:
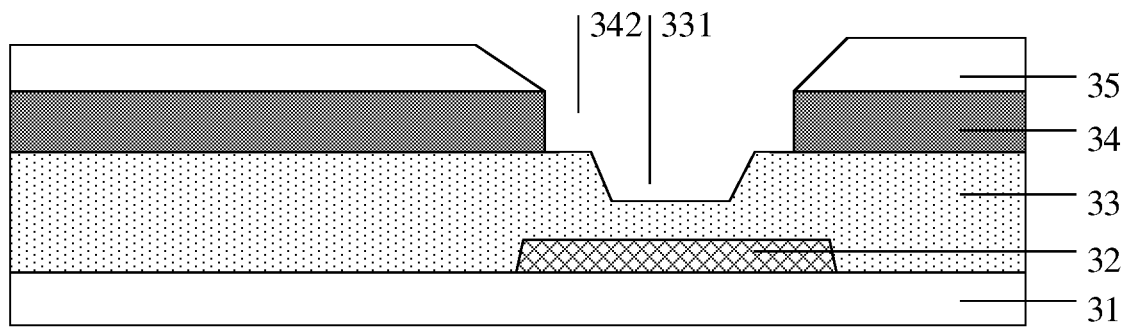
FIG. 8 shows a schematic structural diagram of etching an etching barrier layer to form a second etched hole according to the first embodiment of the present disclosure.

As shown in FIG. 8, since the photoresist 35 on the etching barrier layer 34 near the first transition hole 331 is removed, the exposed etching barrier layer 34 can be directly etched using a third etching process to form a second etched hole 342. The third etching process is a dry etching process or a wet etching process, where the etching gas used in the dry etching process is $O_2$, and the etching solution used in the wet etching process includes cerium ammonium nitrate, glacial acetic acid and water.

It should be noted that the $O_2$ in the etching gas used in the third etching process will also have a certain ashing effect on the photoresist 35. Therefore, the graph of the photoresist 35 in FIG. 8 is different from the graph of the photoresist 35 in FIG. 7.

Figure 9:
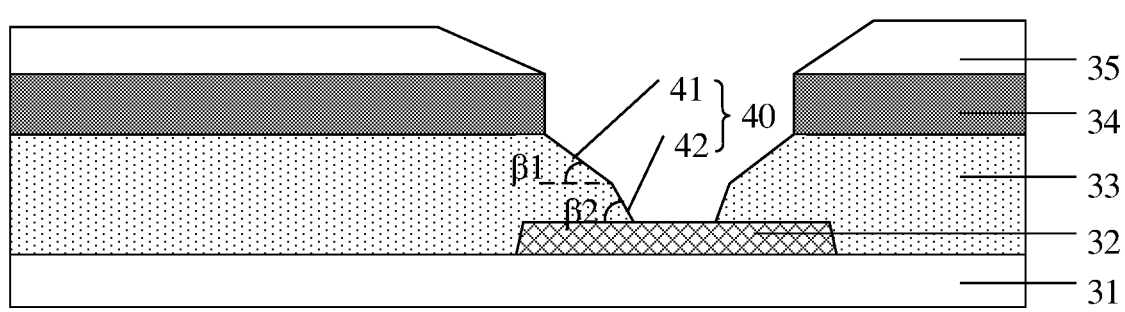
FIG. 9 shows a schematic structural diagram of etching the insulating layer in the second etched hole and the first transition hole to form a connection hole according to the first embodiment of the present disclosure.

As shown in FIG. 9, the etching layer 33 in the second etched hole 342 and the first transition hole 331 is etched using the fourth etching process to form a connection hole 40 that penetrates the insulating layer 33. The fourth etching process is a dry etching process. The etching gas used is a mixed gas of $SF_6$ and $O_2$, or a mixed gas of $CF_4$ and $O_2$.

The connection hole 40 includes a first via hole 41 and a second via hole 42 communicated with the first via hole 41. The slope angle β2 of the second via hole 42 is greater than the slope angle β1 of the first via hole 41. The slope angle β1 of the first via hole 41 can be from 50° to 60°, the slope angle β2 of the second via hole 42 can be from 60° to 70°, the first via hole 41 refers to a part of the connection hole 40 far from the base substrate 31, and the second via hole 42 refers to a part of the connection hole 40 near the base substrate 30.

It can be understood that the etching steps involved in FIG. 7 to FIG. 9 can also be performed multiple times. The pattern size of the etching barrier layer 34 after each etching is different from that of the etching barrier layer 34 after the previous etching, which makes the formed connection hole 40 include a plurality of via holes connected in sequence, and the connection hole 40 is more gentle.

It can be known from the above analysis that the insulating layer 33 can be etched multiple times by the etching barrier layer 34, and the effective blocking area of the etching barrier layer for the etching is gradually reduced during each etching, thereby forming the connection hole 40 penetrating the insulating layer 33, the connection hole 40 includes a plurality of via holes connected in sequence, and the slope angle of the hole wall of each via hole is smaller than the preset slope angle, reducing the slope angle of the connection hole 40, improving the connection effect of the subsequent second metal layer and the first metal layer 32.

It should be noted that when the first etching process, second etching process, third etching process, and fourth etching process are all dry etching processes, the etching gas used for dry etching the etching barrier layer 34 is $O_2$, and the etching gas used for dry etching the insulating layer 33 is a mixed gas of $SF_6$ and $O_2$, or a mixed gas of $CF_4$ and $O_2$. Therefore, when performing continuous dry etching on the etching barrier layer 34 and the insulating layer 33, it only needs to close or open the $SF_6$ or $CF_4$ gas path of the dry etching equipment, continuous etching can be performed in the same dry etching equipment, thereby saving process time.

In the related art, the dry etching time of the insulating layer is longer, as shown in FIG. 1, which causes the photoresist covered above the insulating layer to be denatured or lost by plasma bombardment. The denatured photoresist is more difficult to be stripped off, which will affect deposition of the subsequent film. When the photoresist loses more, the plasma will bombard the surface of the insulating layer protected by the photoresist, causing the deposition interface of the insulating layer and the subsequent film layer originally protected by the photoresist to change, resulting in the generation of Mura (uneven brightness). In the first embodiment of the present disclosure, the photoresist 35 is covered on the etching barrier layer 34, the material of the etching barrier layer 34 is metallic chromium, the interface contacted by the photoresist 35 becomes a metal interface, and the denatured photoresist is also relatively easy to be stripped off. In addition, the etching barrier layer 34 is added on the insulating layer 33, so even if the photoresist loss is large, the plasma will only bombard the etching barrier layer 34, which has no effect on the surface of the insulating layer 33. Subsequently, the etching barrier layer 34 is stripped off, and then other layers are deposited on the insulating layer 33 to avoid the generation of Mura.

In addition, in the related art, photoresist decomposes into free radicals of C, H, and O under the action of the plasma, which easily forms Polymer (hydrocarbon polymer) and gathers in the connection hole, adding the contact resistance of the connection of the subsequent formed second metal layer and the first metal layer 32. The etching gas used for dry etching the etching barrier layer 34 and the insulating layer 33 in the first embodiment of the present disclosure includes $O_2$, and $O_2$ plasma bombards the polymer produced. Thus, the polymer accumulated in the connection hole 40 can be removed, and the increase in contact resistance caused by the aggregation of the polymer can be avoided.

Figure 12:
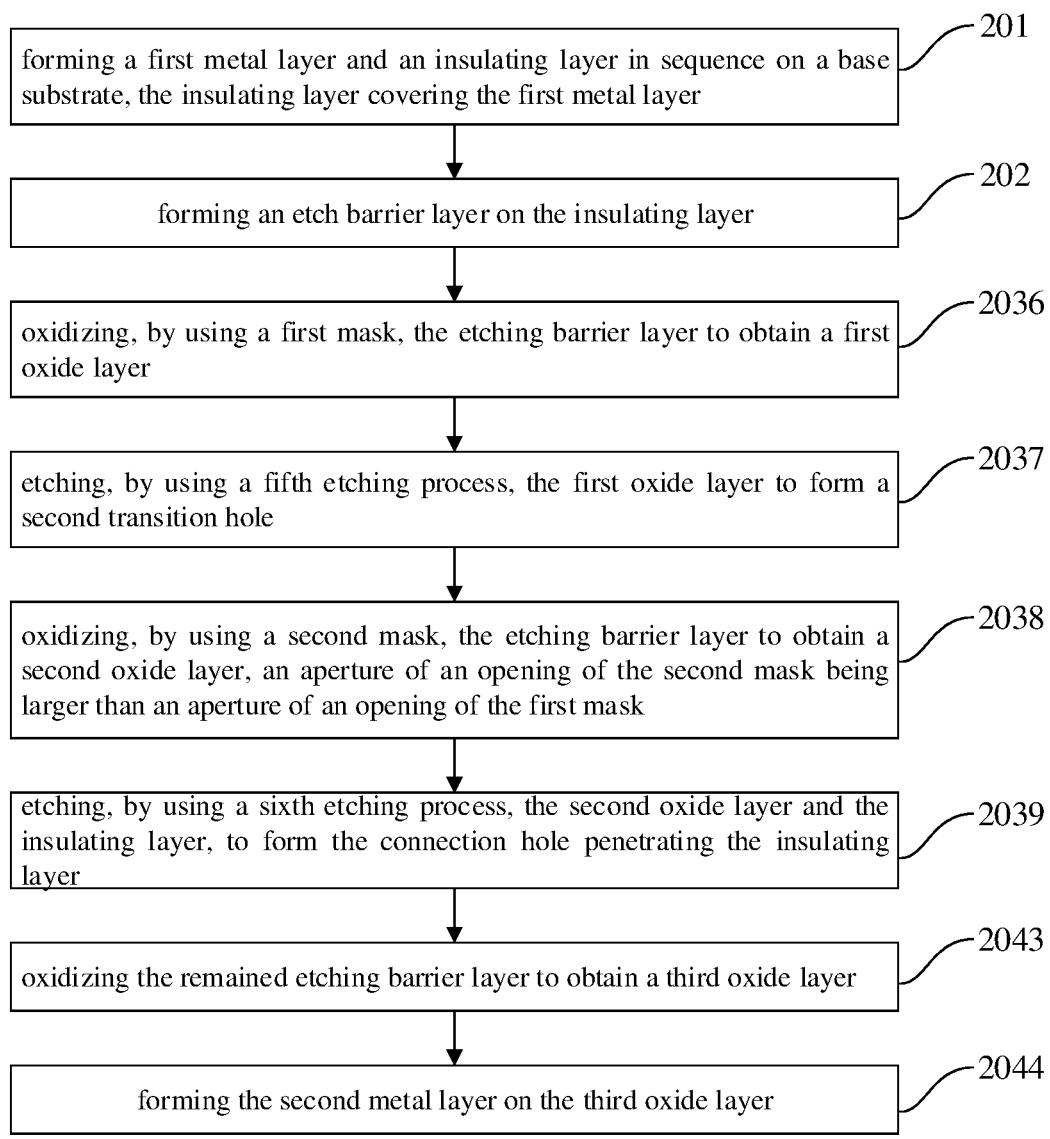
FIG. 12 shows a specific flowchart of the method of manufacturing an array substrate according to a second embodiment of the present disclosure.

Referring to FIG. 12, a specific flowchart of a method of manufacturing an array substrate according to a second embodiment of the present disclosure is shown.

In the second embodiment of the present disclosure, the material of the etching barrier layer 34 is organosiloxane, and the step 203 may specifically include:

a sub-step 2036 of oxidizing, by using a first mask, the etching barrier layer to obtain a first oxide layer;

a sub-step 2037 of etching, by using a fifth etching process, the first oxide layer to form a second transition hole;

a sub-step 2038 of oxidizing, by using a second mask, the etching barrier layer to obtain a second oxide layer, an aperture of an opening of the second mask being larger than an aperture of an opening of the first mask;

a sub-step 2039 of etching, by using a sixth etching process, the second oxide layer and the insulating layer, to form the connection hole penetrating the insulating layer.

The connection hole comprises a first via hole opening to the etching barrier layer and a second via hole communicated with the first via hole and opening to the first metal layer, the slope angle of the hole wall of the second via hole is greater than the slope angle of the hole wall of the first via hole.

FIGS. 13-18 are schematic diagrams of manufacturing an array substrate according to the second embodiment of the present disclosure.

Figure 13:
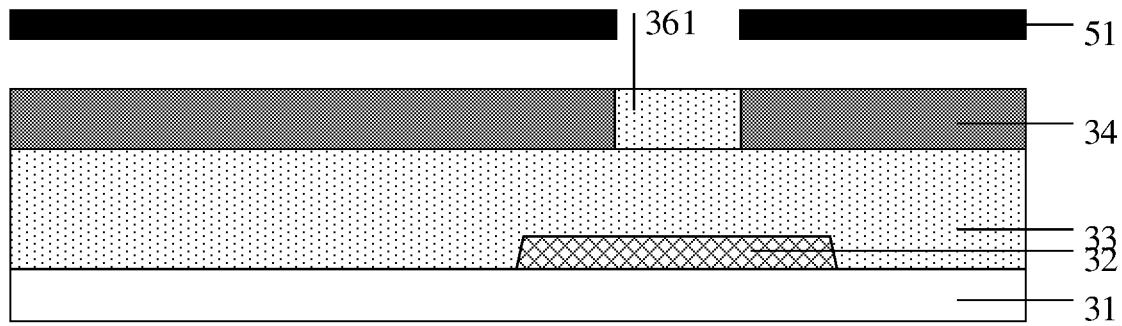
FIG. 13 shows a schematic structural diagram of oxidizing, by using a first mask, the etching barrier layer to obtain a first oxide layer according to the second embodiment of the present disclosure.

As shown in FIG. 13, the first barrier layer 34 is oxidized with a first mask 51 to obtain the first oxide layer 361; specifically, the etching barrier layer 34 is oxidized with ultraviolet or ozone to make the surface of the organosiloxane form inorganic silicon oxide, and then the inorganic silicon oxide is heated and solidified to obtain the first oxide layer 361.

Figure 14:
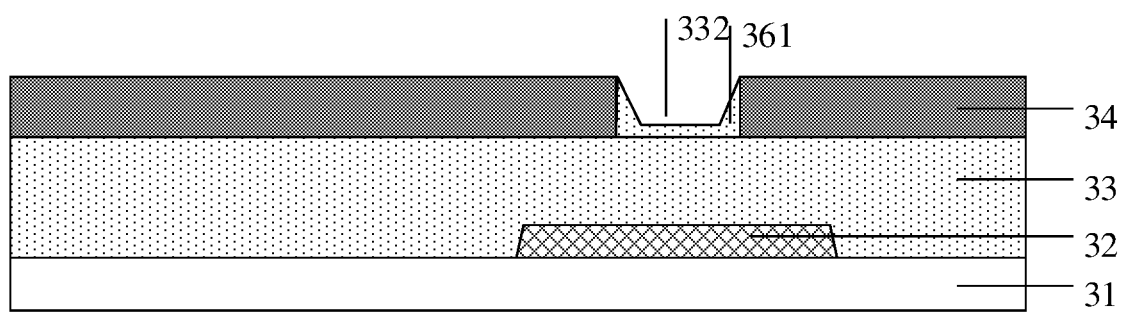
FIG. 14 shows a schematic structural diagram of etching the first oxide layer to form a second transition hole according to the second embodiment of the present disclosure.

As shown in FIG. 14, the first oxide layer 361 is etched using a fifth etching process to form the second transition hole 332. The fifth etching process is a dry etching process, and the etching gas used is $CF_4$. The first oxide layer 361 can be fully etched or partially etched. FIG. 14 shows a schematic diagram of the structure after partial etching.

Figure 15:
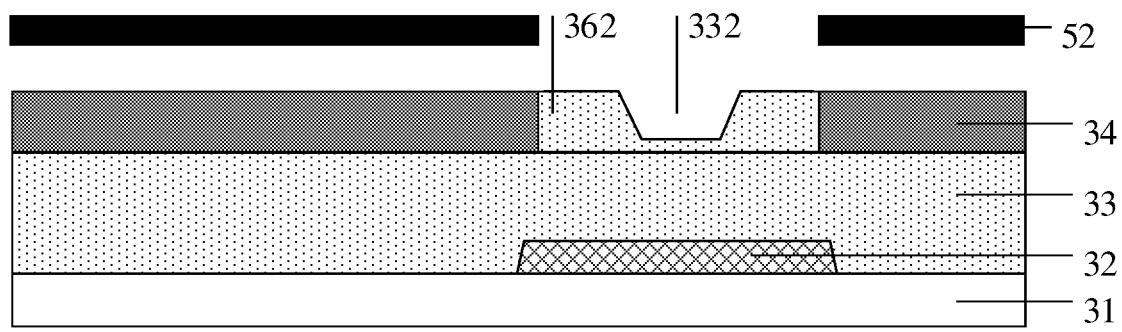
FIG. 15 shows a schematic structural diagram of oxidizing, by using a second mask, the etching barrier layer to obtain a second oxide layer according to the second embodiment of the present disclosure.

As shown in FIG. 15, the second barrier layer 34 is oxidized with a second mask 52 to form the second oxide layer 362. The aperture of the opening of the second mask 52 is larger than the aperture of the opening of the first mask 51; specifically, ultraviolet or ozone is used to oxidize the etching barrier layer 3 so as to form inorganic silicon oxide on the surface of the organosiloxane, and then the inorganic silicon oxide is heated and cured to obtain the first oxide layer 362, and the second oxide layer 362 includes the inorganic silicon oxide after this oxidation, as well as the first oxide layer 361 obtained by the previous oxidation.

Figure 16:
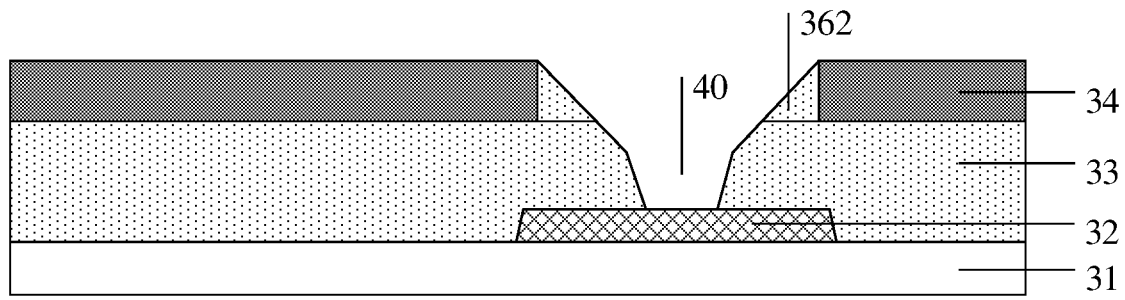
FIG. 16 shows a schematic structural diagram of etching the second oxide layer and the insulating layer to form the connection hole according to the second embodiment of the present disclosure.

As shown in FIG. 16, the sixth oxide process is used to etch the second oxide layer 362 and the insulating layer 33 to form a connection hole 40 penetrating the insulating layer 33. The sixth etching process is a dry etching process, and the etching gas used is $CF_4$.

It can be understood that the oxidation and etching steps involved in FIG. 15 and FIG. 16 can also be performed multiple times. The aperture of the opening of the mask used each time is larger than the aperture of the opening of the mask plate used last time, Therefore, the formed connection hole 40 includes a plurality of via holes connected in sequence, and the connection hole 40 is more gentle.

In the related art, when the insulating layer is dry-etched, the photoresist gradually expands under the bombardment of the plasma, resulting in the subsequent etched connection hole with a larger aperture than the required connection hole, and the etching deviation is large. However, the second embodiment of the present disclosure does not require the use of photoresist, and the etching gas used in the fifth etching process and the sixth etching process has an etching selection ratio of the insulating layer 33 and organosiloxane greater than 10:1, which reduces the deviation of the connection hole etched later.

As shown in FIG. 1, in the related art, the photoresist is denatured or lost by plasma bombardment, which makes photoresist difficult to be stripped off, and it is easy to produce Polymer in the connection hole. However, the second embodiment of the present disclosure does not need to use photoresist, avoiding generation of Polymer in the connection hole. The organosiloxane can be directly oxidized into an insulating layer material (that is, inorganic silicon oxide) without photoresist stripping or development process, so the process is simpler.

In addition, since the organosiloxane can be oxidized into the insulating layer material, the deposition thickness of the insulating layer 33 can be correspondingly reduced when the insulating layer 33 is produced. The smaller the thickness of the insulating layer 33 is, the smaller the difference between the thicknesses of the insulating layer 33 at different positions are, which can improve the uniformity of the thickness of the insulating layer 33, thereby improving the insulation or capacitance effect of the insulating layer 33.

Step 204 is of forming a second metal layer, the second metal layer being connected to the first metal layer through the connection hole.

In the embodiment of the present disclosure, the first metal layer 37 is formed through the patterning process, and the second metal layer 37 is connected to the first metal layer 32 through the connection hole 40. The material of the second metal layer 37 may be a single metal material, or may be a laminated material composed of multiple metals. or may also be a metal alloy material.

As shown in FIG. 4, in the first embodiment of the present disclosure, the step 204 may specifically include:

a sub-step 2040 of removing the photoresist remained on the etching barrier layer;

a sub-step 2041 of removing the etching barrier layer remained on the insulating layer;

a sub-step 2042 of forming the second metal layer on the insulating layer from which the etching barrier layer is removed.

Figure 10:
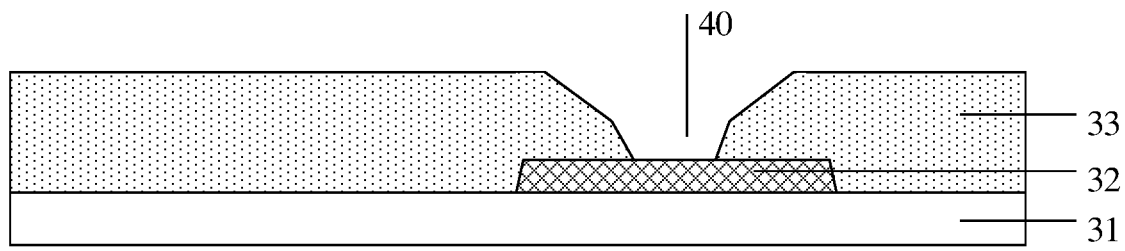
FIG. 10 shows a schematic structural diagram obtained after removing the etching barrier layer and the photoresist according to the first embodiment of the present disclosure.

As shown in FIG. 10, a dry stripping process or a wet stripping process is used to remove the photoresist 35 remained on the etching barrier layer 34. The stripping gas used in the dry stripping process is $O_2$. The wet stripping process includes exposure and development processes. Then, the etching barrier layer 34 remained on the insulating layer 33 is removed, and the etching barrier layer 34 remained on the insulating layer 33 can be removed by a wet etching process.

Figure 11:
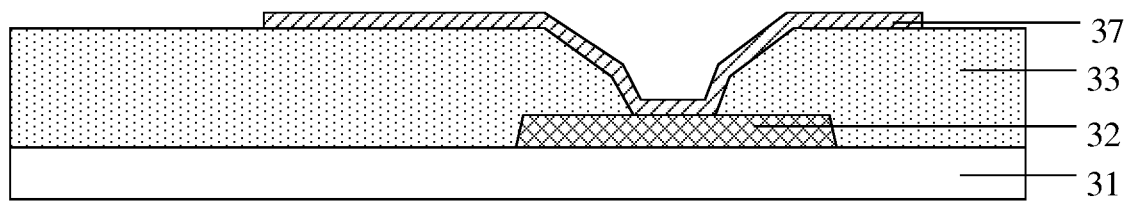
FIG. 11 shows a schematic structural diagram obtained after forming the second metal layer on the insulating layer according to the first embodiment of the present disclosure.

As shown in FIG. 11, the second metal layer 37 is formed on the insulating layer 33 from which the etching barrier layer 34 is removed, and the second metal layer 37 is connected to the first metal layer 32 through the connection hole 40.

As shown in FIG. 12, in the second embodiment of the present disclosure, the step 204 may specifically include:

a sub-step 2043 of oxidizing the remained etching barrier layer to obtain a third oxide layer; and a sub-step 2044 of forming the second metal layer on the third oxide layer.

Figure 17:
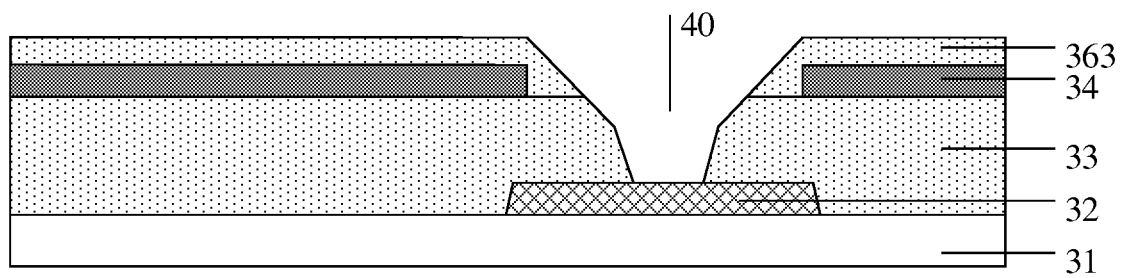
FIG. 17 shows a schematic structural diagram of oxidizing the remained etching barrier layer to obtain a third oxide layer according to the second embodiment of the present disclosure.

As shown in FIG. 17, the remaining etching barrier layer 34 is oxidized to form the third oxide layer 363, which can fully oxidize the remaining etching barrier layer 34 to the third oxide layer 363, or partially oxidize the remaining etching barrier layer 34 to the third oxide layer 363. FIG. 17 shows a schematic diagram of the structure after partial oxidation. By controlling the time of the oxidation treatment, the thickness of the third oxide layer 363 is controlled.

Figure 18:
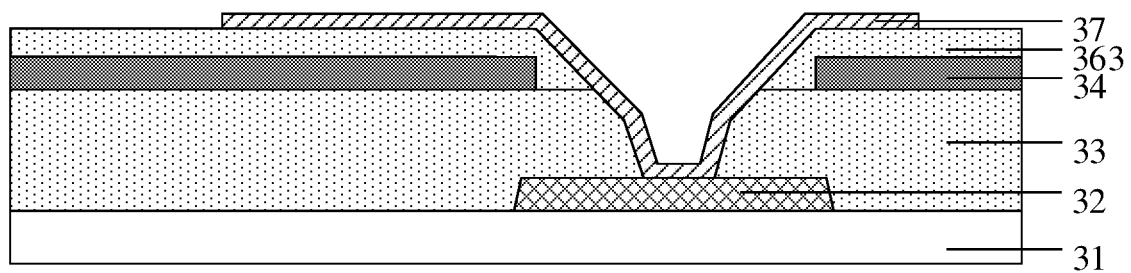
FIG. 18 shows a schematic structural view obtained after forming a second metal layer on the third oxide layer according to the second embodiment of the present disclosure.

As shown in FIG. 18, the second metal layer 37 is formed on the third oxide layer 363. The second metal layer 37 is connected to the first metal layer 32 through the connection hole 40. In fact, the material of the third oxide layer 363 is inorganic silicon oxide, which can also serve as an insulating material.

In the embodiments of the present disclosure, by forming a first metal layer and an insulating layer on a base substrate in sequence, an etching barrier layer is formed on the insulating layer, and the etching barrier layer and the insulating layer are etched multiple times, the effective blocking area of the etching barrier layer is gradually reduced in each etching to form a connection hole penetrating the insulating layer. The connection hole includes multiple via holes connected in sequence, and the slope angle of the hole wall of each via hole is less than the preset slope angle. The second metal layer is formed and is connected to the first metal layer through the connection hole. The etching barrier layer and the insulating layer are etched multiple times, so that the formed connection hole includes a plurality of via holes connected in sequence, and because only a portion of the insulating layer needs to be etched each time, the insulating layer etched each time has a smaller thickness, which ensures that the slope angle of the hole wall of each via hole in the formed connection hole is smaller than the preset slope angle, thereby reducing the slope angle of the hole wall of the connection hole. In the subsequent production of the second metal layer, the poor coverage or disconnection of the second metal layer due to the large connection hole slope angle is avoided, and the poor connection between the first metal layer and the second metal layer is improved.

Embodiments of the present disclosure also provide an array substrate, including: a base substrate 31; a first metal layer 32 formed on the base substrate 31; an insulating layer 33 covering the first metal layer 32; a second metal layer 37 connected to the first metal layer 32 through the connection hole 40 that penetrates the insulating layer 33. The connection hole 40 includes a plurality of via holes connected in sequence, and a slope angle of a hole wall of each via hole is less than a preset slope angle and gradually decrease in a direction away from the base substrate.

As shown in FIG. 11, the second metal layer 37 is formed on the insulating layer 33. As shown in FIG. 18, the second metal layer 34 is formed on the third oxide layer 363. The material of the third oxide layer 363 is inorganic silicon oxide, or can be used as an insulating material.

The array substrate according to the embodiments of the present disclosure may be made by the above-mentioned method of manufacturing an array substrate.

In the embodiments of the present disclosure, the array substrate includes a base substrate, a first metal layer on the base substrate, an insulating layer covering the first metal layer, and a second metal layer connected to the first metal layer through the connection hole; and the connection hole includes a plurality of via holes connected in sequence, and a slope angle of a hole wall of each via hole is less than a preset slope angle. The formed connection hole includes multiple via holes connected in sequence, and the slope angle of the hole wall of each via hole is smaller than the preset slope angle, thereby reducing the slope angle of the hole wall of the connection hole. When the second metal layer is connected to the first metal layer through the connection hole, the poor coverage or disconnection of the second metal layer due to the large connection hole slope angle is avoided, and the poor connection between the first metal layer and the second metal layer is improved.

For the foregoing method embodiments, for the sake of simple description, they are all expressed as a series of action combinations, but those skilled in the art should know that the present disclosure is not limited by the sequence of actions described, because according to the present disclosure, some steps can be performed in other orders or simultaneously. Secondly, those skilled in the art should also know that the embodiments described in the specification are all preferred embodiments, and the involved actions and modules are not necessarily required by the present disclosure.

The embodiments in this specification are described in a progressive manner. Each embodiment focuses on the differences from other embodiments, and the same or similar parts between the embodiments may refer to each other.

Finally, it should be noted that in this article, relational terms such as first and second are used only to distinguish one entity or operation from another entity or operation, and do not necessarily require or imply these entities or there is any such actual relationship or order between operations. Moreover, the terms "comprise", "include" or any other variant thereof are intended to cover non-exclusive inclusion, so that a process, method, commodity or device that includes a series of elements includes not only those elements, but also other elements not explicitly listed, or elements inherent to such processes, methods, goods, or equipment. Without more restrictions, the element defined by the sentence "comprise a . . . " does not exclude that there are other identical elements in the process, method, commodity or equipment that includes the element.

The above describes an array substrate and the method of manufacturing the same provided by the present disclosure in detail. Specific examples are used herein to explain the principles and implementations of the present disclosure. The description of the above embodiments is only used to help understand the present disclosure. At the same time, for those of ordinary skill in the art, according to the ideas of the present disclosure, there will be changes in the specific embodiments and scope of application. In summary, the content of this specification should not be understood as restrictions on the present disclosure.

What is claimed is:

1. A method of manufacturing an array substrate, comprising:
    forming a first metal layer and an insulating layer in sequence on a base substrate, the insulating layer covering the first metal layer;
    forming an etching barrier layer on the insulating layer, wherein the etching barrier layer is in contact with the insulating layer;
    etching the etching barrier layer and the insulating layer multiple times, wherein an effective blocking area of the etching barrier layer decreases successively in each etching to form a connection hole penetrating the insulating layer, the connection hole includes a plurality of via holes connected in sequence, and a slope angle of a hole wall of each via hole is smaller than a preset slope angle; and
    forming a second metal layer, the second metal layer being connected to the first metal layer through the connection hole, wherein
    a material of the etching barrier layer is chromium or organosiloxane; and
    an etching gas is used in the etching the etching barrier layer and the insulating layer multiple times, wherein an etching selection ratio of the etching gas to the insulating layer and the etching barrier layer is greater than 10:1.

2. The method according to claim 1, wherein the preset slope angle is greater than 70°, and the slope angle of the hole wall of the via holes is from 50° to 70°.

3. The method according to claim 1, wherein the step of etching the etching barrier layer and the insulating layer multiple times, to form a connection hole penetrating the insulating layer, comprises:
    coating a photoresist on the etching barrier layer;
    forming a photoresist hole by a patterning process;
    etching, by using a first etching process, the etching barrier layer in the photoresist hole to form a first etched hole;
    etching, by using a second etching process, the insulating layer in the first etching hole to form a first transition hole not penetrating the insulating layer;
    etching, by using a third etching process, the etching barrier layer to form a second etched hole;

etching, by using a fourth etching process, the second etched hole and the insulating layer in the first transition hole to form the connection hole penetrating the insulating layer;

wherein, the connection hole comprises a first via hole opening to the etching barrier layer and a second via hole communicated with the first via hole and opening to the first metal layer, the slope angle of the hole wall of the second via hole is greater than the slope angle of the hole wall of the first via hole; and wherein the material of the etching barrier layer is chromium.

4. The method according to claim 3, wherein the step of forming a second metal layer, comprises:
removing the photoresist remained on the etching barrier layer;
removing the etching barrier layer remained on the insulating layer;
forming the second metal layer on the insulating layer from which the etching barrier layer is removed.

5. The method according to claim 3, wherein the first etching process is a dry etching process or a wet etching process, and the third etching process is a dry etching process or a wet etching process; wherein, an etching gas used in the dry etching process is $O_2$, and an etching solution used in the wet etching process includes ammonium cerium nitrate, glacial acetic acid and water.

6. The method according to claim 3, wherein the second etching process and the fourth etching process are both dry etching processes, and an etching gas used is a mixed gas of $SF_6$ and $O_2$, or a mixed gas of $CF_4$ and $O_2$.

7. The method according to claim 1, wherein the step of etching the etching barrier layer and the insulating layer multiple times, to form a connection hole penetrating the insulating layer, comprises:
oxidizing, by using a first mask, the etching barrier layer to obtain a first oxide layer;
etching, by using a fifth etching process, the first oxide layer to form a second transition hole;
oxidizing, by using a second mask, the etching barrier layer to obtain a second oxide layer, an aperture of an opening of the second mask being larger than an aperture of an opening of the first mask;
etching, by using a sixth etching process, the second oxide layer and the insulating layer, to form the connection hole penetrating the insulating layer;

wherein, the connection hole comprises a first via hole opening to the etching barrier layer and a second via hole communicated with the first via hole and opening to the first metal layer, the slope angle of the hole wall of the second via hole is greater than the slope angle of the hole wall of the first via hole.

8. The method according to claim 7, wherein the step of forming a second metal layer, comprises:
oxidizing the remained etching barrier layer to obtain a third oxide layer; and
forming the second metal layer on the third oxide layer.

9. The method according to claim 7, wherein material of the etching barrier layer is organosiloxane; the etching barrier layer is oxidized by ultraviolet ray or ozone; the fifth etching process and the sixth etching process are both dry etching processes, and an etching gas used is $CF_4$.

10. An array substrate manufactured by using the method according to claim 1, comprising:
a base substrate;
a first metal layer on the base substrate;
an insulating layer covering the first metal layer, wherein the insulating layer is provided with a connection hole penetrating the insulating layer;
a second metal layer connected to the first metal layer through the connection hole, wherein the connection hole includes a plurality of via holes connected in sequence, and a slope angle of a hole wall of each via hole is less than a preset slope angle and gradually decrease in a direction away from the base substrate.

11. The array substrate according to claim 10, wherein the preset slope angle is greater than 70°, and the slope angle of the hole wall of the via holes is from 50° to 70°.

12. The array substrate according to claim 10, wherein the connection hole comprises a first via hole opening to the second metal layer and a second via hole communicated with the first via hole and opening to the first metal layer, the slope angle of the hole wall of the second via hole is greater than the slope angle of the hole wall of the first via hole.

13. The array substrate according to claim 10, wherein the insulating layer is a multilayer structure, and layers in the multilayer structure that are respectively in contact with the first metal layer and the second metal layer are made of an insulating material.

* * * * *